United States Patent [19]

Rotzoll

[11] Patent Number: 5,568,512
[45] Date of Patent: Oct. 22, 1996

[54] COMMUNICATION SYSTEM HAVING TRANSMITTER FREQUENCY CONTROL

[75] Inventor: Robert R. Rotzoll, Meridian, Id.

[73] Assignee: Micron Communications, Inc., Boise, Id.

[21] Appl. No.: 281,384

[22] Filed: Jul. 27, 1994

[51] Int. Cl.$^6$ .............................. H04B 1/38; H04L 5/16
[52] U.S. Cl. .......................... 375/221; 375/358; 370/107
[58] Field of Search ..................................... 375/219, 220, 375/221, 358, 200, 208, 222, 376; 370/31, 32, 37, 76, 107; 340/825.54; 342/51; 455/69, 88, 70

[56] References Cited

U.S. PATENT DOCUMENTS

| | | | |
|---|---|---|---|
| 4,185,241 | 1/1980 | Ewanus et al. | 375/221 |
| 4,929,918 | 5/1990 | Chung et al. | 331/10 |
| 5,003,559 | 3/1991 | Kanai et al. | 375/358 |
| 5,059,979 | 10/1991 | Micic et al. | 341/152 |
| 5,272,730 | 12/1993 | Clark | 375/376 |
| 5,363,419 | 11/1994 | Ho | 375/376 |
| 5,365,551 | 11/1994 | Snodgrass et al. | 375/200 |
| 5,377,232 | 12/1994 | Davidov et al. | 375/358 |

Primary Examiner—Stephen Chin
Assistant Examiner—Don Vo
Attorney, Agent, or Firm—William R. Bachand; Robert J. Stern

[57] ABSTRACT

A communication system is simpler and conserves power by eliminating the need for a reference frequency oscillator in the transmitter circuit. In a battery operated transceiver of the present invention, the receiver portion includes a tracking oscillator. The tracking oscillator output is used to synchronize received data and as a reference frequency source for the transmitter. In a half duplex communication system a reply signal is transmitted while no command signal is being received. Therefore, the transceiver in such a system includes circuitry for maintaining the reference frequency during transmission. Thus, the frequency accuracy of the transmission is based on the frequency accuracy of the received command signal. The tracking oscillator in one embodiment includes a phase locked loop circuit having a voltage controlled oscillator (VCO), an up-down counter, and a digital to analog converter (DAC) for determining the VCO frequency. A transparent latch in series between the counter and the DAC is used to maintain the VCO frequency as a reference frequency for transmission.

13 Claims, 4 Drawing Sheets

COMMUNICATION SYSTEM HAVING TRANSMITTER FREQUENCY CONTROL

FIELD OF THE INVENTION

This invention relates communication systems and methods for transmitter frequency control.

Background of the invention

As an introduction to the problems solved by the present invention, consider the conventional radio frequency identification (RFID) system having an interrogator station and numerous responder stations, sometimes called transponders. Such systems are used, for example, for tracking the movement of animals, people, or articles such as baggage and mail. In these applications, it is desirable to reduce the complexity and also the cost of a transponder to the point that transponders are economically used once and discarded.

Accordingly, developments in radio frequency transponders have included systems that employ a half duplex protocol such as the systems described in U.S. Pat. No. 5,365,551 by Snodgrass et al., incorporated herein by reference.

Conventional half duplex operation requires use of an accurate reference frequency source in the transmitter circuitry of each transponder. Conventional circuits include relaxation and tuned circuit oscillators and crystal controlled oscillators. The former are adversely affected by temperature extremes while the later are less temperature dependent, but require an expensive mounted crystal for operation. Such a crystal mount is not economically compatible with semiconductor fabrication and packaging including thin film packaging.

In view of the problems described above and related problems that consequently become apparent to those skilled in the applicable arts, the need remains in communication systems for improved transmitter frequency control methods and circuitry. It is desirable for such circuitry to be simpler, be compatible with semiconductor fabrication and packaging, use less expensive components, and conserve power.

SUMMARY OF THE INVENTION

Accordingly, a communication system in one embodiment of the present invention includes a first and a second transceiver for communicating a command signal and a reply signal. In operation, the first transceiver transmits a command signal conveying a frequency at a predetermined frequency accuracy. The second transceiver includes a receiver and a transmitter. The second transceiver receives the command signal and transmits the reply signal. The receiver provides a control signal that is responsive to the command signal so that the control signal conveys the predetermined frequency accuracy. The transmitter is coupled to the receiver for receiving the control signal so that the transmitted reply signal has a frequency accuracy that is related to the predetermined frequency accuracy.

According to a first aspect of such an embodiment, the transmitter circuitry is simplified in that the conventional local oscillator circuit is omitted from the transmitter circuit. By omitting circuitry, the cost of manufacturing the transceiver is reduced, the power consumed during operation is reduced, longer operation under battery power is achieved, smaller and lighter batteries are employed, and the reliability of the transceiver is improved. By incorporating such a low-power transceiver into a transponder of the present invention, a smaller, lighter, less expensive, and more reliable transponder is achieved.

In another embodiment of the present invention, a transceiver includes a receiver with a demodulator and a transmitter. A signal received during a first period of time is demodulated to provide a reference signal for transmitter frequency accuracy. The transmitter transmits a second signal after lapse of the first period.

According to an aspect of such an embodiment of the present invention, the second signal has a frequency accuracy derived from the reference signal. Thus, the need for an independent reference frequency source for the transmitter is eliminated. Consequently, benefits already described with reference to the first embodiment of the present invention are obtained.

The present invention may be practiced according to a method for half duplex communication in one embodiment which includes the steps of receiving, during a first period, a first signal having a first frequency, the first frequency characterized by a first accuracy; determining a second frequency responsive to the first frequency, the second frequency characterized by a second accuracy, the second accuracy proportional to the first accuracy; and transmitting, after the first period has lapsed, a reply signal characterized by the second accuracy.

According to a first aspect of such a method, accurate transmitter frequency control is obtained without a reference frequency source.

Another embodiment of such a method is used for spread spectrum communication. Such spread spectrum communication has a chip rate for modulation with a pseudo noise sequence. The method in this embodiment further includes the steps of determining the chip rate from the first signal and determining a clock rate by dividing the chip rate by an integer divisor. The step of determining the second frequency as in the first embodiment further includes the step of determining the second frequency by multiplying the clock rate by an integer factor.

According to an aspect of such a method, implementation in binary logic is facilitated so that circuit complexity is reduced. Reduced circuit complexity has attendant benefits already discussed above.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a broad arrow symbolically represents a group of signals that together signify a binary code. For example, the output of a binary counter is represented by a broad arrow because a binary count is signified by the signals on several conductors taken together at an instant in time. A group of signals having no binary coded relationship is shown as a single line with an arrow. A single line between functional blocks conveys one or more signals.

Signals that appear on several figures and have the same mnemonic are coupled together by direct connection or by additional devices.

DETAILED DESCRIPTION OF THE INVENTION

Figure 1:
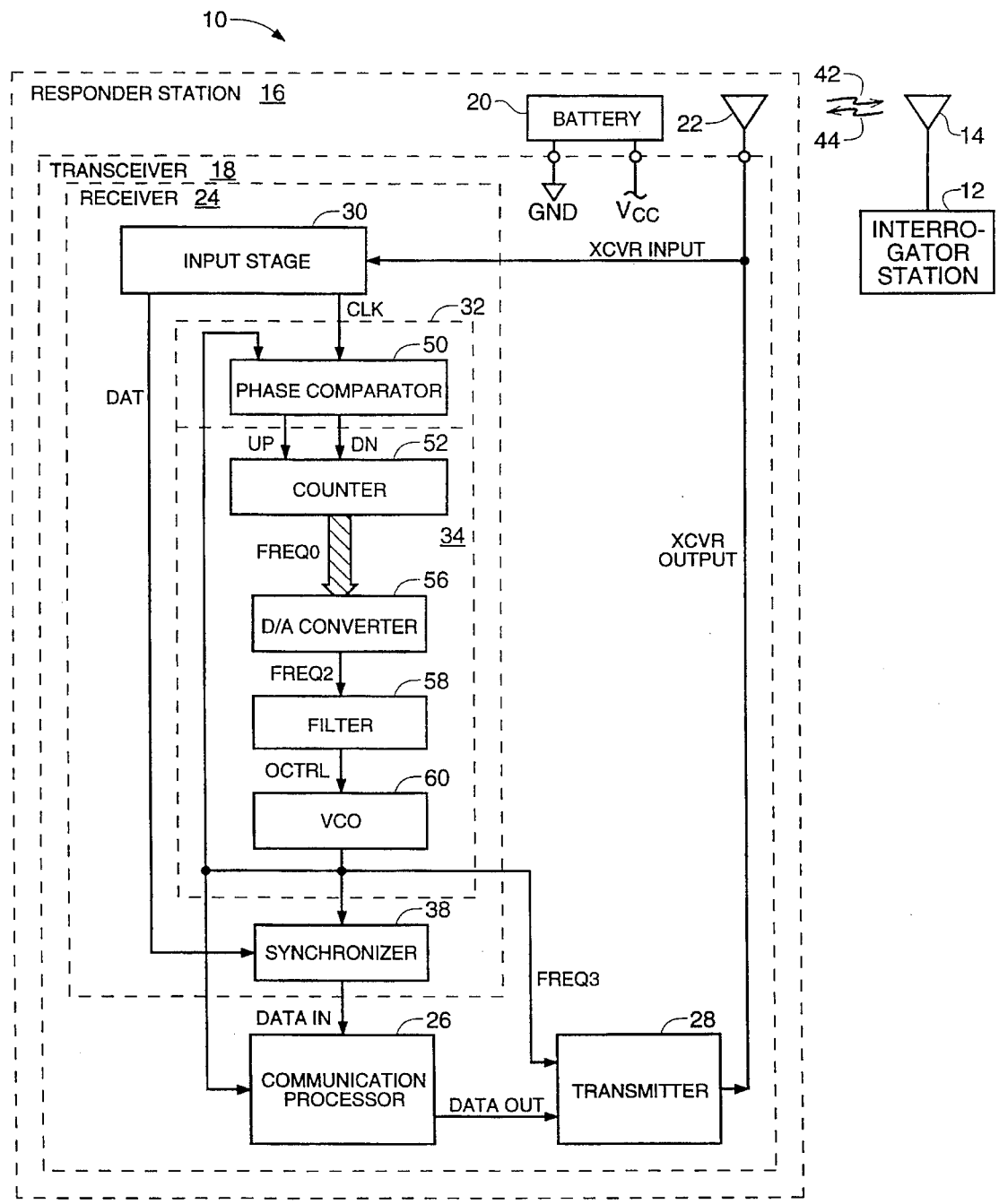
FIG. 1 is a functional block diagram of a communication system according to an embodiment of the present invention.

FIG. 1 is a functional block diagram of a communication system according to an embodiment of the present invention. System 10 is of the type described in U.S. Pat. No. 5,365,551 incorporated herein by reference with novel structure and operation discussed below. System 10 includes interrogator station 12 for broadcasting command signal 44 from antenna 14. Command signal 44 includes means for addressing responder station 16 alone or in addition to addressing a multiplicity of responder stations identical to station 16. In response to command signal 44, station 16 transmits reply signal 42 to complete a command-reply scenario. Hence, responder station 16 is a type of transponder that automatically transmits a reply signal when the proper interrogation is received. In the illustrated embodiment, microwave radio bands are used for the command and reply signals. Since, in this embodiment, transmission of command signal 44 is completed by interrogator station 12 prior to transmission of reply signal 42 by station 16, communication is by definition half duplex. Half duplex communication using the same communication channel is preferred for simplicity of antenna design, reduced circuit complexity attributed in part to shared components, and for reduced cross talk among circuits attributed to exclusive operation of either the transmitter or the receiver at a station. Where such features are less important, in an alternate and equivalent embodiment, station 16 is a cross-band transponder.

Interrogator 12 employs a crystal controlled frequency reference source or the transmitted command signal. The receiver portion of interrogator station 12 employs a phase locked loop with a wider search range than for example the loop 34, 50 to be discussed below. These features are compatible with the relaxed size and power consumption criteria for design of interrogator station 12.

Responder station 16 includes transceiver 18, battery 20, and antenna 22, assembled using thin film technology so that a flat package similar to a postage label is achieved. Battery 20 in one embodiment is a lithium cell that provides power signal $V_{cc}$ and ground reference signal GND for operation of transceiver 18. Transceiver 18 is an integrated circuit having both analog and CMOS digital logic circuits. Antenna 22 receives command signal 44 and couples it to receiver 24 as signal XCVR INPUT. Antenna 22 is also coupled to transmitter 28 so that signal XCVR OUTPUT is broadcast as reply signal 42.

Transceiver 18 includes transmitter 28, receiver 24, and communication processor 26. In a preferred embodiment, communication between interrogator station 12 and responder station 16 includes spread spectrum modulation of signals to be transmitted and demodulation of received signals of the type described in U.S. Pat. No. 5,365,551.

Transmitter 28 receives serial digital signal DATA OUT from processor 26, and for each bit, applies a pseudo noise modulation scheme to provide a spread spectrum signal as XCVR OUTPUT. In one embodiment, transmitter 28 employs a phase locked loop for frequency multiplication by a factor of 32 followed by 3 analog frequency doubler circuits. The signal XCVR OUTPUT is, thus, 256 times the frequency of signal FREQ3. The voltage controlled oscillator at the heart of the phase locked loop (PLL) has a center frequency of about 300 megahertz. The PLL has less phase noise than the doublers and in an alternate embodiment having an eight times higher center frequency, doublers are not used.

Signal XCVR OUTPUT has several characteristic frequencies. Serial data corresponding to signal DATA OUT is conveyed at a lowest frequency called the baud rate. In one embodiment each bit of signal DATA OUT is modulated to form a predetermined number of chips. Hence, the second characteristic frequency is called the chip rate, being an integer multiple of the baud rate. A chip is essentially a time slot in which a burst at the third characteristic frequency called the transmit frequency selectively appears. The third frequency in one embodiment is a microwave frequency. In a preferred embodiment, the transmit frequency is about 2.44 gigahertz, being 256 times the chip rate; the chip rate is 63 times the baud rate; so that the baud rate about 150 megabaud. In alternate and equivalent embodiments other integer multipliers are used.

In the preferred embodiment, the first and second characteristic frequencies are derived from the third characteristic frequency by frequency division. Techniques for frequency division are well known, as are techniques for detecting the transmit frequency of a received signal. In the embodiment shown, both the command signal and the reply signal are modulated using pseudo noise sequence spread spectrum techniques. It is not necessary that the command and reply signals be modulated using the same relationships, using integer relationships, or using binary factors between characteristic frequencies, only that the relationships are determined prior to demodulation of a received signal.

Receiver 24 includes input stage 30, tracking oscillator 32, and synchronizer 38. Command signal 44 is received by antenna 22 as signal XCVR INPUT coupled to input stage 30. Input stage 30 filters, rectifies, and amplifies signal XCVR INPUT to detect a clock component as signal CLK and a data component as signal DAT. Signal CLK is coupled to tracking oscillator 32 for generation of signal FREQ3.

Tracking oscillator 32 includes phase comparator 50 and variable frequency oscillator (VFO) 34. The output of VFO 34 is coupled as a reference signal to phase comparator 50. In operation, a phase difference between signal FREQ3 and signal CLK is detected by phase comparator 50. If signal FREQ3 lags in phase from signal CLK, phase comparator 50 generates signal UP, coupled to VFO 34, for increasing the frequency, and thereby advancing the phase of signal FREQ3. Conversely, phase comparator 50 generates signal DN, also coupled to VFO 34, for decreasing the frequency of signal FREQ3. If the phase difference is within a narrow range, neither signal UP nor signal DN is generated, so that the current frequency of signal FREQ3 is maintained. Thus, the absence of signals UP and DN constitutes a signal for maintaining the VFO frequency. Phase comparator 50 in one embodiment employs an edge detector and in an alternate and equivalent embodiment includes an exclusive-OR gate and a full wave rectifier.

Due to the feedback of signal FREQ3 to phase comparator 50, phase comparator 50 and VFO 34 cooperate as a phase locked loop. In an alternate and equivalent embodiment, phase comparator 50 is replaced with a frequency comparator so that the loop operates as a frequency locked loop. As a result of the feedback, tracking oscillator 32 generates signal FREQ3 at a frequency corresponding to the frequency of signal CLK. Therefore, two properties of signal FREQ3 convey information regarding signal CLK. First, the frequency of signal CLK is conveyed as the frequency of signal FREQ3. Second, any variation in the frequency of signal CLK, i.e. the frequency accuracy of signal CLK, is conveyed by the frequency accuracy of signal FREQ3.

Variable frequency oscillator 34 includes, in series connection, counter 52, digital to analog converter (DAC) 56, filter 58, and voltage controlled oscillator (VCO) 60. Counter 52 responds to signals UP and DN to respectively increment and decrement a binary count used to form the output binary signal FREQ0. In the absence of signals UP and DN, the count remains unchanged. The current count directs the operating frequency of the VCO.

Signal FREQ0 is coupled to DAC 56 wherein the count is converted to an analog voltage signal FREQ2. DAC 56 in one embodiment has 16 bits resolution of which 10 bits are stable. Drift must be minimum and at least drift free for the duration of the reply signal. For the intended operation of tracking oscillator 32, t he monotonicity of DAC 56 is of greater concern than step size accuracy. The resulting converted signal FREQ2 is smoothed by filter 58 so that artifacts of quantization on the resulting signal OCTRL are attenuated.

Signal OCTRL is coupled to VCO 60. VCO 60 has a comparatively low center frequency. In one embodiment the center frequency is 38 megahertz. Due to the lower center frequency, tracking oscillator 32 has better thermal stability, lower noise generating and sensitivity characteristics, and generates signal FREQ3 with lower phase noise characteristics than an embodiment with a conventional voltage controlled oscillator having a center frequency on the order of 300 megahertz. VCO 60 converts the amplitude of the analog voltage to an output oscillation having a frequency corresponding to the amplitude. The frequency of signal FREQ3 corresponds to the baud rate of the command signal.

In an alternate and equivalent embodiment not shown, signal OCTRL is coupled in place of signal FREQ3 to a modified transmitter in place of transmitter 28. In such an embodiment, the modified transmitter includes a second VCO as a reference frequency source. However, the frequency accuracy of such a transmitter is dependent on the frequency accuracy of the XCVR INPUT signal in the same manner as described above.

In the embodiment shown in FIG. 1, transmitter signal FREQ3 is coupled to synchronizer 38. Synchronizer 38 receives data component signal DAT to be synchronized with, that is clocked by, signal FREQ3. Synchronizer 38 in one embodiment includes a D-type flip flop with signal DAT coupled to the D-input and signal FREQ3 coupled to the CLK-input. The Q-output of such a flip flop provides synchronized data signal DATA IN to communication processor 26.

Communication processor 26 decodes data conveyed by signal DATA IN, determines whether responder station 16 has been addressed by the command signal, and selectively formats reply data as signal DATA OUT, coupled to transmitter 28. In a preferred embodiment signal DATA IN and signal DATA OUT are coupled as serial data signals, each on one conductor. However, in alternate and equivalent embodiments multiple parallel conductors may be used to replace serial coupling with parallel coupling. In a preferred embodiment, communication processor 26 includes a synchronous state machine clocked by signal FREQ3. In alternate and equivalent embodiments, communication processor 26 includes a microprocessor.

In summary, transceiver 18 detects the transmit frequency of signal XCVR INPUT and derives the chip rate and baud rate frequencies. An oscillating signal FREQ3 conveys the baud rate frequency to the transmitter so that the transmitter needs no other frequency reference circuit for modulating the signal XCVR OUTPUT. As a consequence, the frequency accuracy of reply signal 42 corresponds to the frequency accuracy of command signal 44.

Figure 2:
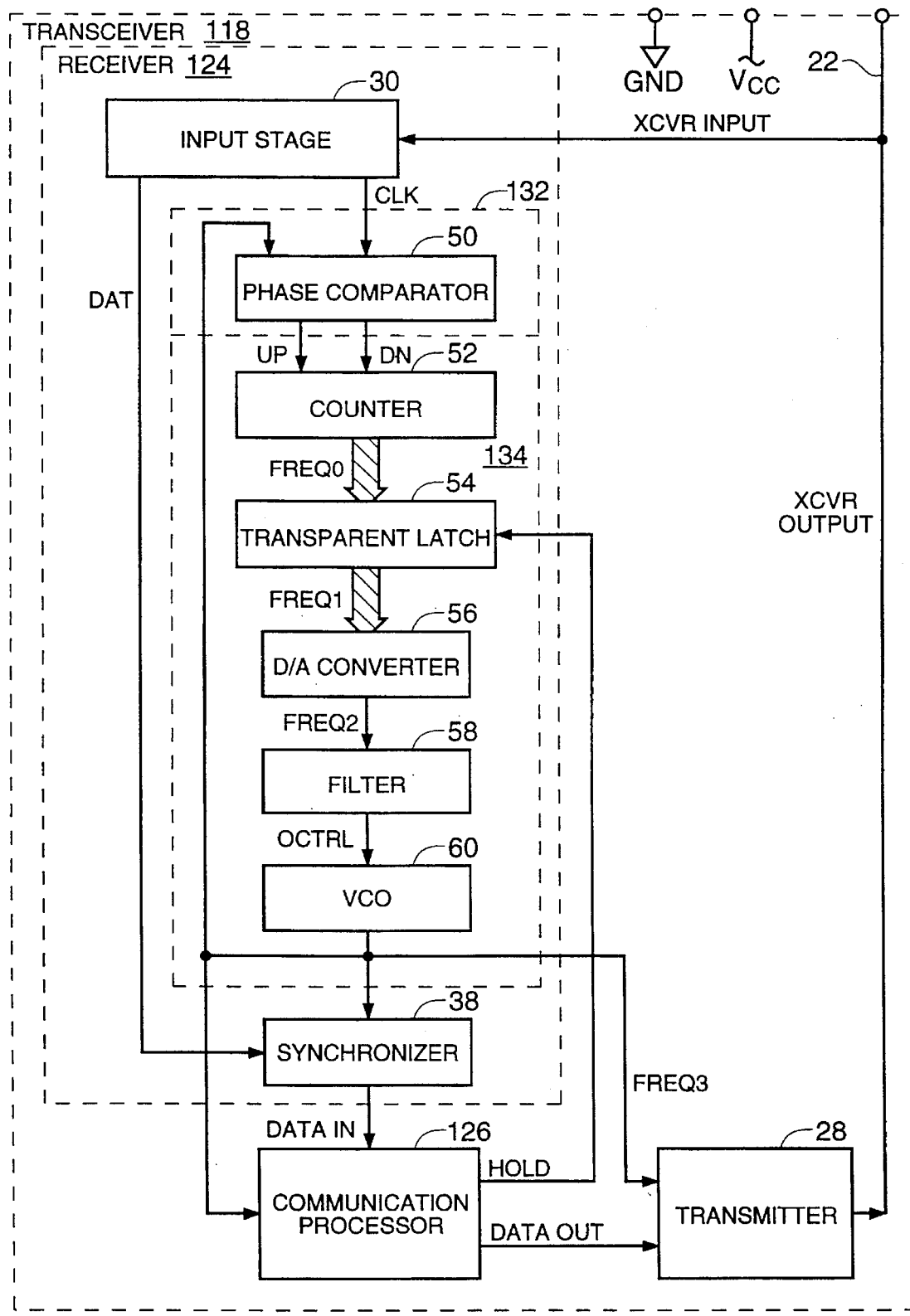
FIG. 2 is a functional block diagram of a transceiver in an alternate embodiment of the communication system of FIG. 1.

FIG. 2 is a functional block diagram of a transceiver in an alternate embodiment of the communication system of FIG. 1. Transceiver 118 is similar to transceiver 18 as to similarly numbered items already described. For increased functionality to be described, transceiver 118 includes receiver 124 and communication processor 126; receiver 124 includes tracking oscillator 132; and VFO 134 includes transparent latch 54.

Communication processor 126 provides signal HOLD to transparent latch 54 after determining that a complete message has been received without error as conveyed by signal DATA IN. The determination of error in the received message includes many tests including in a preferred embodiment, proper address, chip rate, validity of chip sequence, occurrence of a Barker code, absence of uncorrectable error, and fewer than a maximum tolerable number of correctable errors. In an alternate and equivalent embodiment, signal HOLD is generated during the reception of a cyclic redundancy code at the end of the command message. If the received code varies from the expected value, the HOLD signal is removed and the latch remains transparent.

Transparent latch 54 couples signal FREQ0 to DAC 56 in the absence of signal HOLD. In response to signal HOLD, transparent latch 54 ignores further changes in signal FREQ0 and maintains signal FREQ1. By maintaining signal FREQ1, VCO 60 continues to generate oscillator signal FREQ3 in the absence of signal XCVR INPUT. Thus, when transmission of command signal 42 has been completed, transmitter 28 continues to receive signal FREQ3 for modulating and transmitting reply signal XCVR OUTPUT.

Latch 54 is located near D/A converter 56. However, counter 52 is located far from the remaining loop components so that receiver performance is not degraded by the cross coupling of logic signals with signals in the receiver. As a second advantage, power dissipation in this embodiment is lower than the embodiment shown in FIG. 1 because when transmitting, power is removed from input stage 50 and from counter 52.

Figure 3:
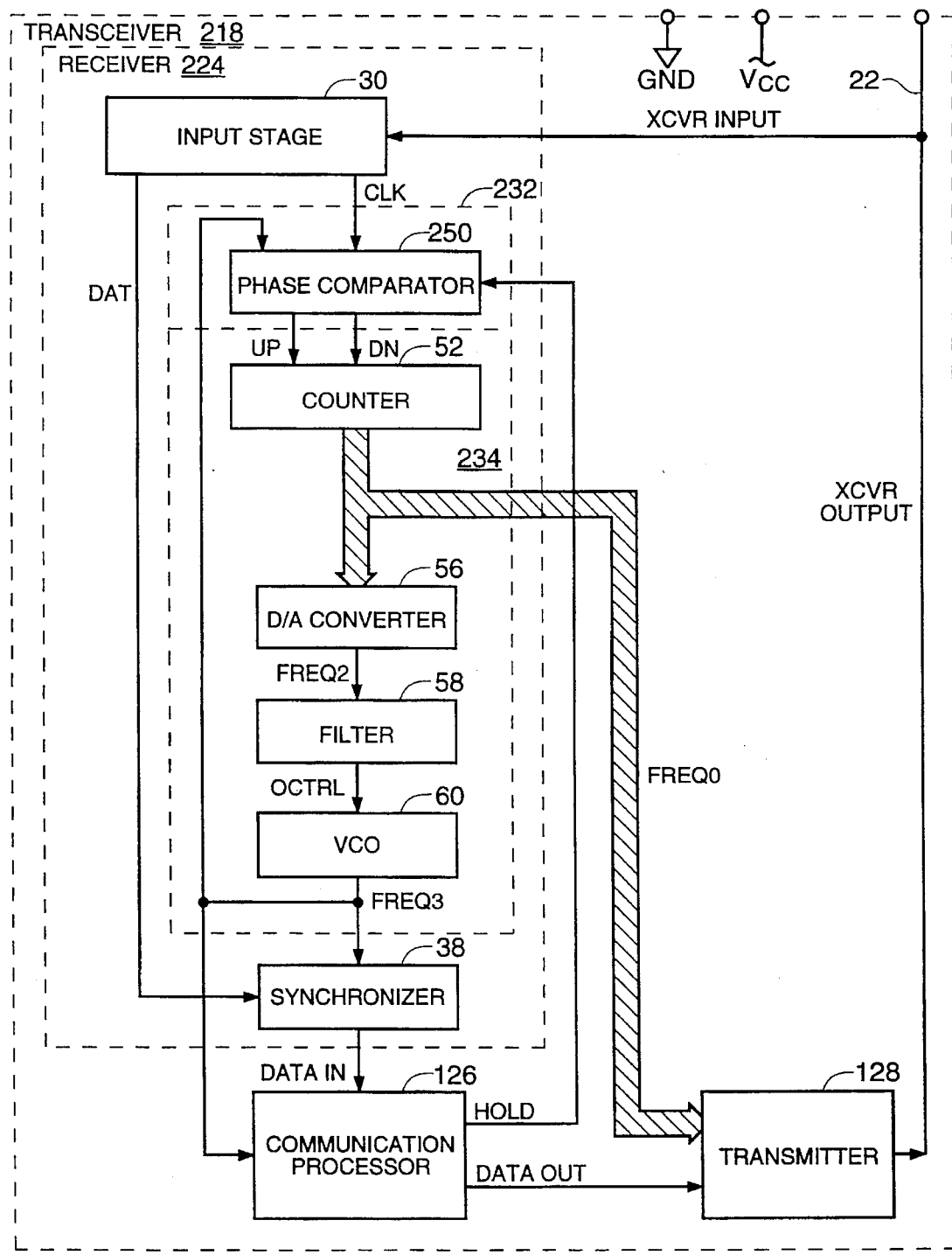
FIG. 3 is a functional block diagram of a transceiver in a second alternate embodiment of the communication system of 1.

FIG. 3 is a functional block diagram of a transceiver in a second alternate embodiment of the communication system of 1. Transceiver 218 is similar to transceiver 18 as to similarly numbered items already described. For increased functionality to be described, transceiver 218 includes transmitter 128 and receiver 224; and receiver 224 includes tracking oscillator 232.

In addition to providing signal FREQ0 to DAC 56 as in VFO 34 and 134 shown in FIGS. 1 and 2, counter 52 provides signal FREQ0 to transmitter 128 in place of signal FREQ3, shown in FIGS. 1 and 2. By receiving frequency control information in binary format conveyed by signal FREQ0, transmitter 128 generates signal XCVR OUTPUT by tuning, selecting, multiplying, or converting the information conveyed by signal FREQ0 so that no local reference frequency source is necessary within transmitter 128.

Figure 4:
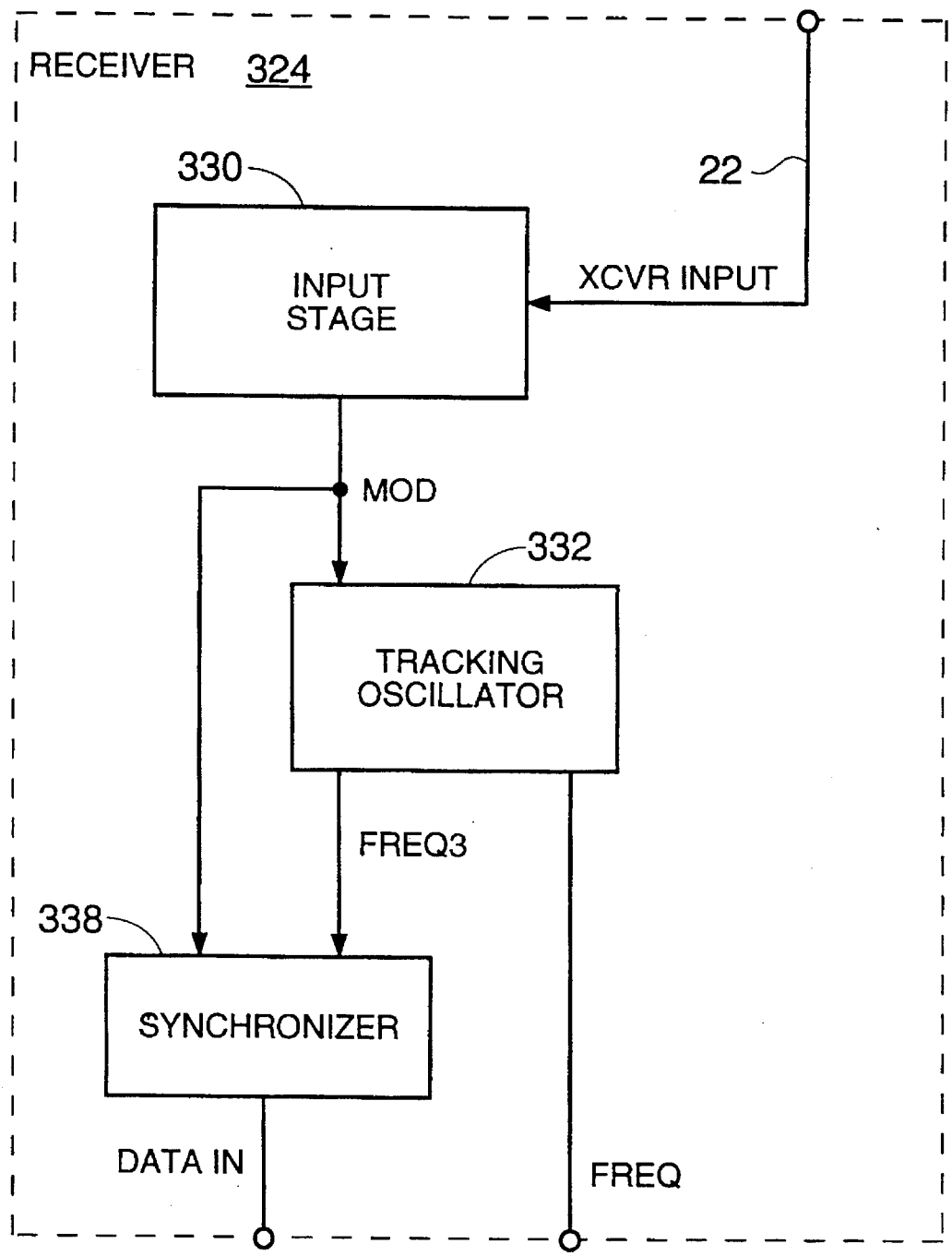
FIG. 4 is a functional block diagram of a receiver in a third alternate embodiment of the communication system of 1.

FIG. 4 is a functional block diagram of a receiver in a third alternate embodiment of the communication system of 1. Receiver 324 is used in place of receiver 24, 124, and 224 in alternate and equivalent embodiments of communication systems of the present invention. Receiver 324 is similar to receiver 24 as to similarly numbered items already described. For increased functionality to be described, receiver 324 includes input stage 330, tracking oscillator 332, and synchronizer 338.

Input stage 330 amplifies and detects data and clock signals conveyed by signal XCVR INPUT. In contrast to input stage 30, already described with reference to FIG. 1, input stage 330 provides a self-clocking signal MOD from which tracking oscillator 332 derives clock signal FREQ3. In the preferred embodiment, signal MOD is a Manchester coded signal. In alternate and equivalent embodiments, other known self-clocking codes are used.

Signal MOD is coupled to tracking oscillator 332 for derivation of clock signal FREQ3 from signal MOD. Signal MOD is also coupled o synchronizer 338 for derivation of data signal DATA IN from signal MOD. Synchronizer 338 clocks the derived data signal with signal FREQ3 to assure adequate set up and hold synchronization times as required by communication processor 26 or 126. In an alternate and equivalent embodiment, signal FREQ3 is not used because the self-clocking features of signal MOD permit derivation of synchronized signal DATA IN from signal MOD with sufficient synchronization accuracy.

The foregoing description discusses preferred embodiments of the present invention, which may be changed or modified without departing from the scope of the present invention.

For example, the polarity of input or output signals and that the logical unctions described above may be implemented using different voltage or current polarities. As another example, the VCO in an alternate embodiment is replaced with an oscillator whose output frequency is controlled by a characteristic value of a control signal (such as current, frequency, period, etc.) used as a proxy for voltage in the embodiments discussed above. As still another example, the tracking oscillator, described as employing a phase locked loop, in an alternate embodiment employs an injection lock oscillator as known in the art.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes cooperating components in separate enclosures, cooperating components in paired or grouped enclosures; alternate communication media between components used generally in the art for communication such as vacuum, fluids, and gases; and alternate forms of energy including light, vibration, and other known physical effects.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value" or "magnitude." The value may be instantaneous or an average.

What is claimed is:

1. A communication system comprising:
   A) a first transceiver for transmitting a command signal conveying a frequency value; and
   B) a second transceiver for receiving the command signal and for transmitting a reply signal, wherein the second transceiver comprises
      1) a receiver comprising a tracking oscillator for detecting said frequency value and for providing a control signal responsive to the command signal, said control signal conveying said frequency value, and
      2) a transmitter coupled to the receiver and responsive to the control signal, for providing the reply signal having a frequency accuracy responsive to said frequency value;
   C) wherein:
      1) the command signal is characterized by a first phase;
      2) the tracking oscillator provides a reference signal characterized by a second phase and characterized by a reference frequency, the control signal being provided responsive to thereference signal; and
      3) the tracking oscillator further comprises
         a) a phase comparator for selectively providing a resultant signal from the set of signals consisting of a first signal, a second signal, and a third signal, the selection responsive to comparing the first phase with the second phase, and
         b) a variable frequency oscillator for providing the reference signal, the variable frequency oscillator responsive to the first signal, the second signal, and the third signal for respectively increasing, decreasing, and maintaining the reference frequency.

2. The system of claim 1 wherein:
   a. the second transceiver further comprises a communication processor for providing a hold signal; and
   b. the tracking oscillator is responsive to the hold signal for maintaining the reference frequency.

3. The system of claim 2 wherein the phase comparator provides the third signal as the resultant signal when the hold signal is received.

4. The system of claim 2 wherein the variable frequency oscillator comprises a counter characterized by a count, the counter responsive to the resultant signal so that the reference frequency is responsive to the count.

5. The system of claim 4 wherein the counter maintains the count in response to the hold signal.

6. The system of claim 2 wherein the variable frequency oscillator further comprises:
   a. a counter characterized by a count, the counter responsive to the resultant signal for providing a counter output signal conveying the count; and
   b. a transparent latch for providing a latched count signal in response to the hold signal, the reference frequency responsive to the latched count signal, the latched count signal being responsive to the counter output signal in the absence of the hold signal.

7. An RF transceiver for receiving a transceiver input RF signal and for transmitting a transceiver output RF signal in response to the input RF signal, the input RF signal being modulated with data characterized by a data clock frequency, comprising:

a) a receiver section including
  i) an input stage, connected to receive the transceiver input RF signal, for demodulating the input RF signal to produce a receiver clock signal having a frequency the same as the data clock frequency of the input RF signal, and
  ii) a tracking oscillator, connected to receive the receiver clock signal, for producing a reference signal having a frequency which is locked to the frequency of the receiver clock signal; and
b) a transmitter section having a frequency multiplier circuit, connected to receive the reference signal, for producing a transceiver output RF signal having a frequency which is the product of the frequency of the reference signal and a predetermined multiplying factor, wherein the frequency of said output RF signal is not based on any frequency reference which is independent of said reference signal;
c) whereby the frequency Of the transceiver output RF signal is controlled by the data clock frequency of the transceiver input RF signal.

8. An RF transceiver according to claim 7, wherein the tracking oscillator comprises:

a) a phase comparator, connected to receive the receiver clock signal and the reference signal, for producing a comparator output signal having a value selected from a first value, a second value, and a third value according to whether the reference signal has a phase angle which is respectively lagging, leading, or close to the phase angle of the receiver clock signal; and
b) a variable frequency oscillator for producing the reference signal and for changing the frequency of the reference signal upward and downward, respectively, in response to the comparator output signal having the first value and the second value, respectively.

9. An RF transceiver according to claim 8, wherein the variable frequency oscillator comprises:

a) a digital counter for producing a digital count which increments in response to the comparator output signal having the first value and which decrements in response to the comparator output signal having the second value;
b) a digital-to-analog converter for producing an analog control signal whose value is proportional to the digital count; and
c) a controlled oscillator for producing the reference signal and for establishing the frequency of the reference signal in response to the analog control signal.

10. An RF transceiver according to claim 7, wherein the tracking oscillator comprises:

a) a frequency comparator, connected to receive the receiver clock signal and the reference signal, for producing a comparator output signal having a value selected from a first value, a second value, and a third value according to whether the reference signal has a frequency which is respectively less than, greater than, or close to the frequency of the receiver clock signal; and
b) a variable frequency oscillator for producing the reference signal and for changing the frequency of the reference signal upward and downward, respectively, in response to the comparator output signal having the first valise and the second value, respectively.

11. An RF transceiver according to claim 10, wherein the variable frequency oscillator comprises:

a) a digital counter for producing a digital count which increments in response to the comparator output signal having the first value and which decrements in response to the comparator output signal having the second value;
b) a digital-to-analog converter for producing an analog control signal whose value is proportional to the digital count; and
c) a controlled oscillator for producing the reference signal and for establishing the frequency of the reference signal in response to the analog control signal.

12. An RF transceiver for receiving a transceiver input RF signal and for transmitting a transceiver output RF signal in response to the input RF signal, the input RF signal being modulated with data characterized by a data clock frequency, comprising:

a) a receiver section including
  i) an input stage, connected to receive the transceiver input RF signal, for demodulating the input RF signal to produce a receiver clock signal having a frequency the same as the data clock frequency of the input RF signal,
  ii) a phase comparator, connected to receive the receiver clock signal and a reference signal, for producing a comparator output signal having a value selected from a first value, a second value, and a third value according to whether the reference signal has a phase angle which is respectively lagging, leading, or close to the phase angle of the receiver clock signal,
  iii) a digital counter for producing a digital count which increments in response to the comparator output signal having the first value and which decrements in response to the comparator output signal having the second value,
  iv) a digital-to-analog converter for producing an analog control signal whose value is proportional to the digital count, and
  v) a controlled oscillator for producing said reference signal having a frequency established in response to the analog control signal; and
b) a transmitter section, connected to receive the digital count, for producing a transceiver output RF signal having a frequency controlled by the digital count;
c) whereby the frequency of the transceiver output RF signal is controlled by the data clock frequency of the transceiver input RF signal.

13. An RF transceiver for receiving a transceiver input RF signal conveying a message and for transmitting a transceiver output RF signal in response to the input RF signal, the input RF signal being characterized by one or more characteristic frequencies, comprising:

a) a receiver section including
  i) an input stage, connected to receive the transceiver input RF signal, for producing a receiver clock signal having a frequency the same as one of the characteristic frequencies of the input RF signal,
  ii) a tracking oscillator, connected to receive the receiver clock signal, for producing a reference signal having a frequency which is locked to the frequency of the receiver clock signal, wherein the tracking oscillator includes a controlled oscillator, having an input connected to receive a control signal, for producing said reference signal and for establishing the frequency of the reference signal in response to the control signal, iii) a communication processor for detecting whether the transceiver input RF signal includes an error-free message and, if so, for producing a hold signal, and iv) a latch circuit for storing the value of the control signal when the communication processor produces the hold signal and for providing the stored control signal value to the input of the controlled oscillator when a transceiver input RF signal is absent; and b) a transmitter section, connected to receive the reference signal, for producing a transceiver output RF signal having a frequency derived from the frequency of the reference signal;

c) whereby the frequency of the transceiver output RF signal is controlled by said one characteristic frequency of the transceiver input RF signal, and whereby the frequency of the transceiver output RF signal remains controlled even when a transceiver input RF signal is absent.

* * * * *